United States Patent
Abu Qahouq

(10) Patent No.: US 9,577,425 B1
(45) Date of Patent: Feb. 21, 2017

(54) SYSTEMS AND METHODS FOR CONTROLLING POWER SWITCHING CONVERTERS FOR PHOTOVOLTAIC PANELS

(75) Inventor: Jaber A. Abu Qahouq, Tuscaloosa, AL (US)

(73) Assignee: THE BOARD OF TRUSTEES OF THE UNIVERSITY OF ALABAMA, Tuscaloosa, AL (US)

(*) Notice: Subject to any disclaimer, the term of this patent is extended or adjusted under 35 U.S.C. 154(b) by 1130 days.

(21) Appl. No.: 13/478,939

(22) Filed: May 23, 2012

Related U.S. Application Data

(60) Provisional application No. 61/488,847, filed on May 23, 2011.

(51) Int. Cl.
*H02J 1/00* (2006.01)
*H02J 1/10* (2006.01)

(52) U.S. Cl.
CPC .................................. *H02J 1/102* (2013.01)

(58) Field of Classification Search
CPC ..................................... H02J 1/00; H02J 3/00
USPC .................................................. 307/82, 77
See application file for complete search history.

(56) References Cited

U.S. PATENT DOCUMENTS

| | | | | |
|---|---|---|---|---|
| 7,126,053 | B2* | 10/2006 | Kurokami | H01L 31/0687 136/252 |
| 8,212,409 | B2* | 7/2012 | Bettenwort | H02J 1/102 307/82 |
| 2008/0150366 | A1* | 6/2008 | Adest | H02J 3/383 307/77 |
| 2009/0284240 | A1* | 11/2009 | Zhang | G05F 1/67 323/285 |
| 2011/0285205 | A1* | 11/2011 | Ledenev | H02J 3/385 307/63 |

* cited by examiner

*Primary Examiner* — Rexford Barnie
*Assistant Examiner* — Joseph Inge
(74) *Attorney, Agent, or Firm* — Maynard Cooper & Gale, P.C.; Jon Holland

(57) ABSTRACT

A photovoltaic (PV) system has a plurality of PV panels that convert solar energy into electrical energy. Each PV panel is coupled to a respective switching power converter. A parameter (e.g., voltage or current) of a combined current signal from each of the switching power converters is sensed, and a controller controls the duty cycle of each switching power converter in order to maximize the sensed parameter. In this regard, the controller adjusts the duty cycles of the power switching converters in groups while the duty cycles of other power switching converters are held constant in order to set the duty cycles for maximum power transfer, thereby accounting for variations in the power output by each PV panel.

8 Claims, 6 Drawing Sheets

SYSTEMS AND METHODS FOR CONTROLLING POWER SWITCHING CONVERTERS FOR PHOTOVOLTAIC PANELS

CROSS REFERENCE TO RELATED APPLICATION

This application claims priority to U.S. Provisional Patent Application No. 61/488,847, entitled "System and Method for Maximum Power Transfer with Multiple Energy Sources and Power Converters," and filed on May 23, 2011, which is incorporated herein by reference.

BACKGROUND AND RELATED ART

Although there have been improvements in efficiency of photovoltaic (PV) cells, their success as efficient energy producers is also dependent on how their outputs are interfaced with powered devices. PV cells are typically connected in series arrangements to obtain a desired voltage value, and then the series arrangements are connected in parallel to obtain a desired current level. These arrangements of PV cells and their electrical interconnections are placed on a support structure to form a PV panel. The energy available from the PV panel is dependent on the characteristics of the PV cells and the amount of light energy, usually from the sun, striking the PV panel. In order to maximize the transfer of available energy from the PV panel, a load connected to the panel must have a resistance value that provides maximum power transfer. Furthermore, the value of that resistance should be controlled in order to maintain an impedance match with the output impedance of the PV panel as the output characteristics of the PV panel change.

In general, a PV system for providing electrical energy comprises PV panels, DC power converters, and controllers. For other PV systems, the energy sources may be combinations of PV panels and PV cells. A DC power converter is coupled to each PV panel and is used to convert the panel output voltage and current to a load voltage and load current. The load voltage is applied to a load, such as a battery, heater or other device. The output of the converter is controlled by a controller so that the load voltage has a desired value and the load current has values dependent on the power available from the respective PV panel.

For most PV systems, a dedicated converter serves as a variable load to each PV panel and has an output suitable for supplying energy to a load. The output of the PV panel is coupled to the input of the converter. If the controller of the converter operates using a maximum power point tracker (MPPT) algorithm, then most of the energy available from a panel is available (except for losses in converter components) at the output of the converter. It is well known that when an MPPT algorithm of a controller controls the operation of the converter, then maximum power is available to a load connected to the converter. For a typical solar power system, a dedicated controller and converter are assigned to each solar panel. The controller monitors the output voltage and output current of its respective solar panel and uses an MPPT algorithm to adjust the duty cycle of the converter in order to obtain maximum power transfer. Because the input resistance of the converter is the resistance seen by the solar panel, that resistance should change in response to the panel changes in order to maximize power transfer. By varying the duty cycle of the converter, the input impedance of the converter changes in such a way that maximum power is transferred to a load connected to the output of the converter.

A power converter is a device that converters one voltage value to another voltage value. Power converters, such as switching DC-to-DC converters, are capable converting a variety of input voltages to a desired output voltage and output current. These switching DC-to-DC converters, hereafter called converters, are often used with alternative energy sources such as PV panels and wind turbines. Such converters have a controller that responds quickly to the changing output characteristics of the alternative energy source in order to extract maximum energy. Although embodiments of a controller described in this disclosure are used to extract maximum energy from multiple PV panels, the controller may be used by other energy sources. Other types of converters, sometimes called inverters, may convert outputs from PV panels into AC voltages that are coupled to a power distribution grid.

It is understood by those working in solar energy technology that shadows from clouds can cause sudden changes in the available energy from a PV panel so that any device that extracts maximum power must adapt to these changing conditions. Converters capable of adapting to the output changes of a PV panel usually have a controller that uses the MPPT algorithm. Controllers that use the MPPT algorithm cause a converter to serve as variable resistance to the PV panel in such a way that power transfer is at a maximum. Controllers that use the MPPT algorithm are complex and must be connected to sensors that continuously monitor voltages and currents. As with most technologies complexity is directly related to cost, so that an improved control system could reduce the cost of producing solar energy.

A PV panel 10 is depicted in FIG. 1. The PV panel 10 comprises multiple PV cells 20 that are connected together so as to provide an output voltage and current at output port 12. The output voltage of the PV panel across the two conductors of the port is $V_P$, and the output current, $I_P$, flows from the port when a load (not shown) is connected across the port. Since power, $P=V*I$, then the maximum power point (MPP) occurs at the knee of the PV output curve depicted in FIG. 2. At the MPP, the resistance of a load must equal $V_{max}/I_{max}$. When no load is connected to the PV panel the panel voltage is $V_{OC}$ and when the output terminals are short circuited the current flowing is $I_{SC}$. Note that $V_{max}$ is less than $V_{OC}$ and $I_{max}$ is less than $I_{SC}$. For conventional solar energy systems, a dedicated converter and MPPT controller is assigned to each PV panel of the system so that maximum energy is extracted from the system despite uneven characteristic of the outputs of the PV panels.

BRIEF DESCRIPTION OF THE DRAWINGS

The disclosure can be better understood with reference to the following drawings. The elements of the drawings are not necessarily to scale relative to each other, emphasis instead being placed upon clearly illustrating the principles of the disclosure. Furthermore, like reference numerals designate corresponding parts throughout the several views.

DETAILED DESCRIPTION

As the efficiencies for photovoltaic (PV) cells increase, their use as a source of energy also increases. In order to obtain the optimum benefit from PV cells or PV panels, the cells or panels should transfer energy at or near their maximum power point (MPP). The output of a panel, a voltage and current, typically needs to be conditioned before it is connected to a system load, such as a battery system, electric motor, or other device. A converter serves as an interface between a PV array and a system load. Although the information of the disclosure is focused on converters.

An embodiment of a PV system in accordance with the present disclosure comprises multiple PV panels wherein each panel is coupled to a converter. Each converter provides a voltage to a power bus causing load current to flow. A sensor senses load current or load voltage, and a controller generates control signals in response to the parameter sensed by the sensor and also sends a control signal to each of the converters. The controller is configured to generate control signals based on a maximum power point tracking algorithm. The control signals are arranged in time so that each converter has its parameters adjusted while parameters of the other converters are frozen.

Figure 1:
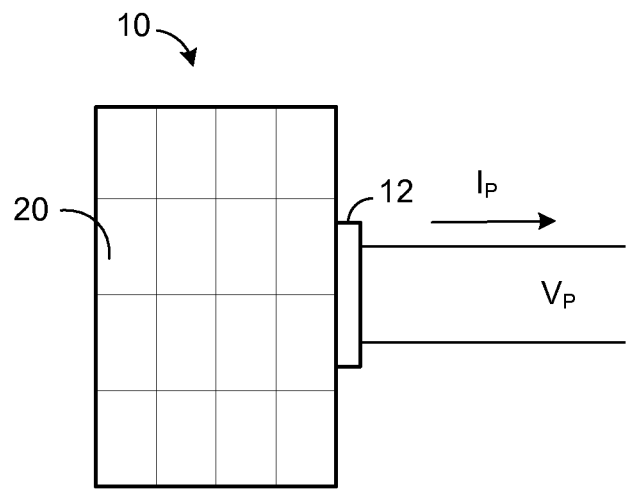
FIG. 1 depicts a photovoltaic panel.
Figure 2:
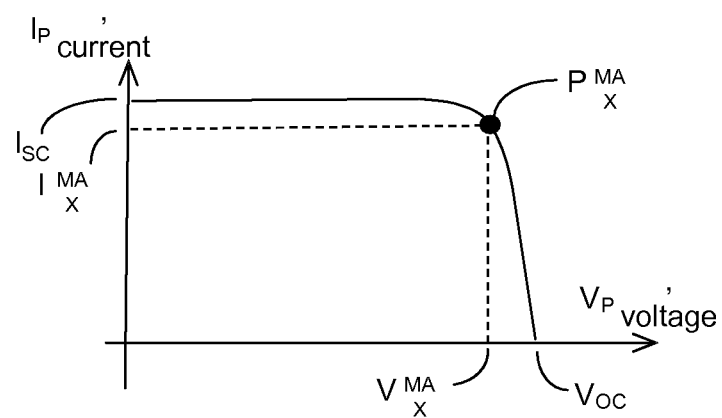
FIG. 2 depicts a voltage-current graph of a photovoltaic panel showing a maximum power transfer point.
Figure 3:
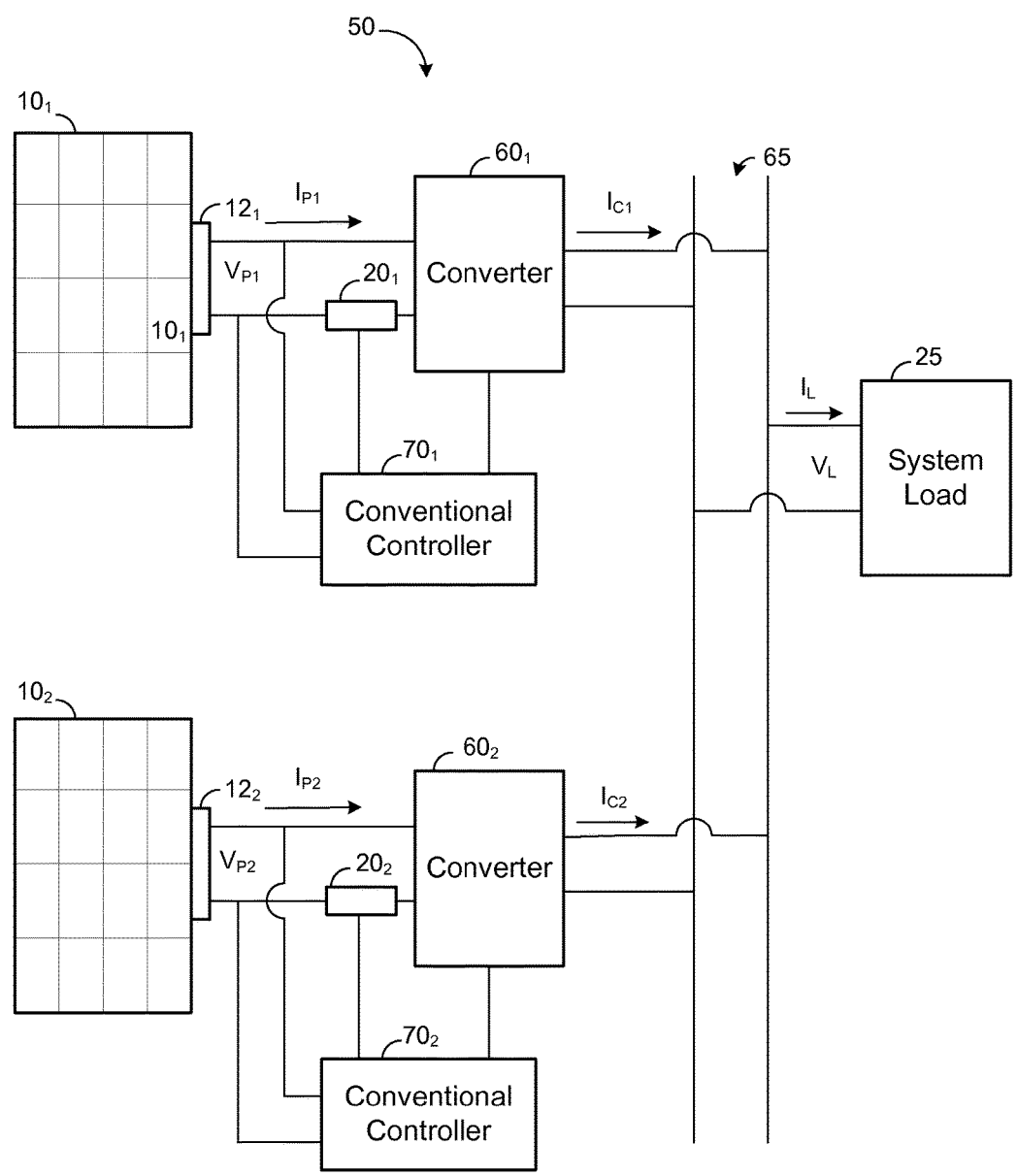
FIG. 3 depicts a conventional photovoltaic system connected to a load.

FIG. 3 depicts a conventional PV power system 50 comprising two PV panels 10 each coupled to a respective power switching converter 60. Each converter 60 has an output port having two conductors that are coupled to a power bus 65. The output voltage of each converter 60 is approximately equal to the load voltage, $V_L$. Current to the load, $I_L$, receives a portion of its current from each of the converters 60. Each converter 60 is controlled by a respective conventional controller 70. Each conventional controller 70 senses the output voltage of its respective PV panel 10 and senses the current flow from the panel with a sensor 20. The sensors are usually analog circuits and analog-to-digital converters (ADCs) are needed to put the sensed voltage and sensed current in a digital format for each of the respective controllers 70 that are typically digital devices. Each conventional controller 70 provides a control signal to its respective converter 60 for controlling the converter 60 in order to provide maximum power transfer to the load 25. The conventional controller 70 generates the control signal using a MPPT algorithm that responds to changes in the sensed current and voltage. For example, when the energy available from a PV panel 10 decreases, the control signal from the corresponding controller 70 reduces the duty cycle of the converter 60 causing the output current of the converter 60 to decrease while keeping the output voltage of the converter 60 at a value equal to the load voltage. Although the conventional PV system 50 depicted in FIG. 3 depicts a system having two PV panels 10, two converters 60, two controllers, 70 and four sensors 20 with their ADCs, other conventional PV systems with greater numbers of devices operate in the same way and would require a corresponding increase in the number of control and sensing devices.

Figure 4:
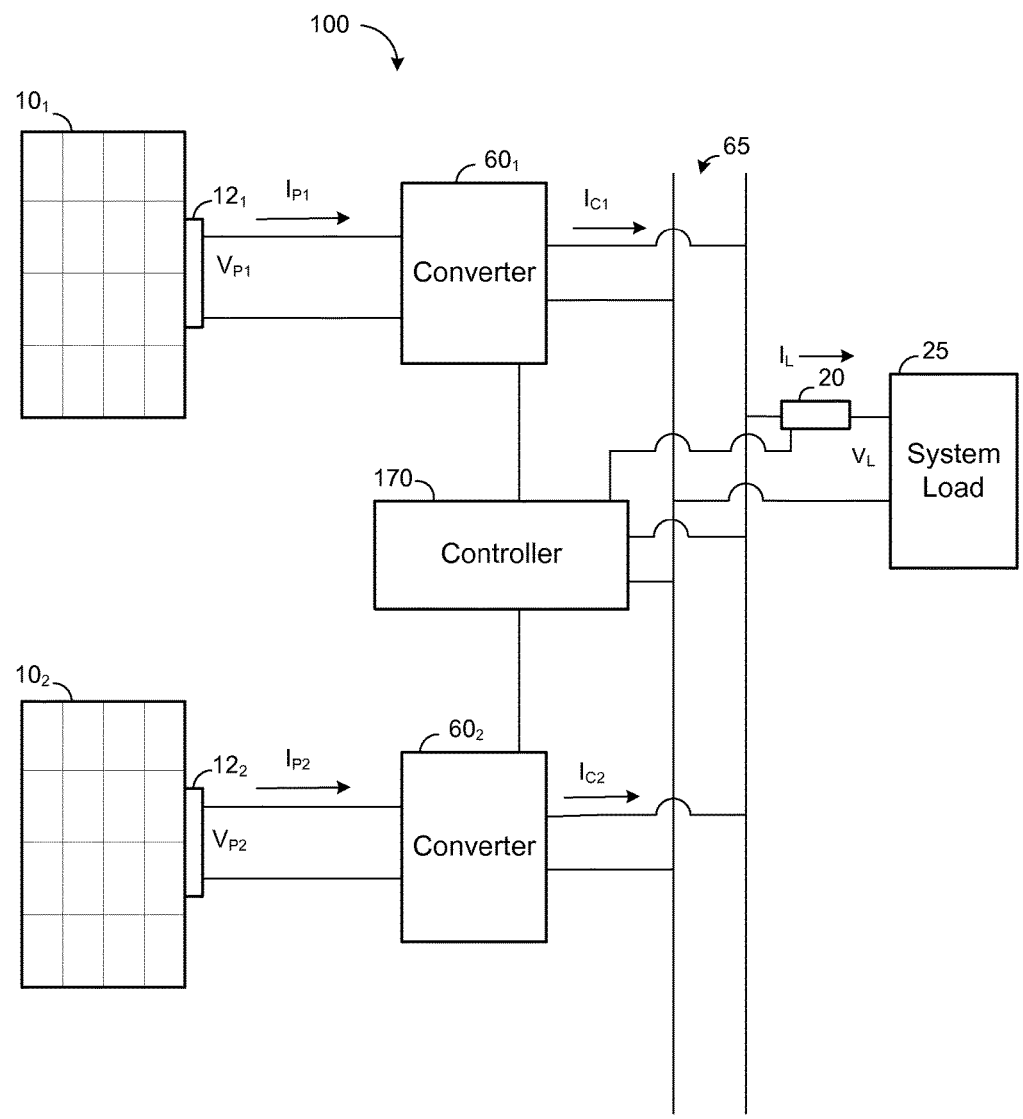
FIG. 4 depicts an exemplary embodiment of a photovoltaic system in accordance with the present disclosure.

An exemplary embodiment of a PV system 100 in accordance with the present disclosure is depicted in FIG. 4. The embodiment as depicted has two PV panels 10, but the principles described for the embodiment apply to systems having other numbers of PV panels and other types of energy producing elements. Each PV panel 10 is coupled to a respective converter 60. Each converter 60 serves as an interface device that delivers a respective converter current, $I_{C1}$ or $I_{C2}$, via voltage bus 65 to system load 25. The output current of the load, $I_L$, is the sum of the converter currents, and the output voltage of each converter 60 is approximately equal to the load voltage, $V_L$. The output current of a converter 60, flowing towards bus 65, has a value that depends on the power output of the PV panel 10. In one exemplary embodiment, as the energy available from a PV panel 10 increases, the current from the corresponding converter 60 increases, but the voltage remains unchanged. The power out of the converter 60 is equal to its output current times its output voltage, and the power input is equal to the current flowing into the converter 60 times the voltage across the input terminals of the converter 60. Because the electrical components within the converter 60 have some losses, the output power is less than the input power.

In order for a converter 60 to provide maximum power transfer of energy from its corresponding PV panel 10 to system load 25, it is desirable for each converter 60 to adapt to changes in its respective PV panel's power output. The converters 60 adapt to changes in their PV panels by adjusting their duty cycle, D. If the energy available from a PV panel 60 increases, then its respective converter 60 should increase its duty cycle to allow more of that energy to reach the system load 25.

Controller 170 is configured to control, i.e., adjust, the duty cycle of each converter 60 to ensure that the converters 60 operate in a state that provides maximum power transfer. For the PV system 100 depicted in FIG. 4, having two PV panels 10 and two converters 60, the controller 170 provides a control signal for each of the converters 60. Each control signal is generated in response to changes in the load current as will be described below. In one embodiment, during a first interval of time, a first control signal instructs the first converter to increment its duty cycle while a second control signal instructs the second converter to freeze its duty cycle. The first control signal to the first converter $60_1$ instructs such converter $60_1$ to increment its duty cycle. If the load current increases when the duty cycle is increasing, then the duty cycle is changing in the right direction. If not, then the control signal instructs the converter $60_1$ to decrement the duty cycle. The duty cycle is increased and decreased until a new maximum load current is obtained. During the changes in the duty cycle of the first converter $60_1$, the component of load current from the first converter, $I_{C1}$, has a maximum possible value based on the amount of power available from its PV panel. During another interval of time, the duty cycle of the first converter is frozen. After the first converter has its duty cycle frozen, then the duty cycle of the second converter is incremented and decremented in response to a control signal from the controller 170. The duty cycle of the second converter $60_2$ is incremented and decremented until its portion of the load current, $I_{C2}$, has a maximum possible value. Note that as the amount of energy available to all of the PV panels decreases, the load current decreases, and as amount of energy available to all of the PV panels increases, the load current increases. The procedure, an algorithm, described above is one implementation of the MPPT algorithm. The above process may be expanded to provide maximum power transfer for a PV system with other numbers of PV panels. In such case, the controller 170 sets the duty cycles one-by-one. While the duty cycles of one converter is being set, the duty cycles of the other converters are frozen (or, in other words, held constant).

The exemplary embodiment of the PV system 100 depicted in FIG. 4 has several structure differences that distinguish it from conventional PV system 10 depicted in FIG. 3. As an example, conventional PV system 10 senses currents and voltages at the input of each converter 60, whereas PV system 100 only one parameter, such as the load current or load current, though it is possible for the system 100 to sense more than one parameter. Each of the controllers 70 for the conventional PV system 10 is dedicated to one converter 60. The controller 170 of the PV system 100 multiple converters via a time shared arrangement. Further, in one embodiment, the PV system 100 uses only one sensor and one ADC, whereas the conventional PV system 10 uses four sensors and four ADCs. If another PV panel 10 is added to the PV system 100, no new control hardware is required. In contrast, the conventional PV system 10 requires two more sensors and two more ADCs for each PV panel 10 added.

A startup procedure for the PV system 100 is preferably used since a PV system normally shuts down when sunlight disappears. It is understood that light energy from the sun at the beginning of a day is relatively small. An initial duty cycle value is set for each of the converters 60 as startup values. The startup duty cycle value is set at a value below what is the expected optimal value, learned from history, of the duty cycle. The controller 170 is configured to simultaneously increment the duty cycle of each converter 60 until a global maximum power value is reached, i.e., when $I_L*V_L$ goes from an increasing value to a decreasing value. Next, all the duty cycle ratios are frozen. The controller 170 then increments and decrements the duty cycle of the first converter 60 until the converter 60$_1$ provides a maximum current (or maximum voltage in other embodiments). The controller 170 then freezes the first converter duty cycle and adjusts the duty cycle of the second converter 60$_2$ until it provides its maximum current (or maximum voltage in other embodiments). When both converters 60 provide maximum current (or maximum voltage in other embodiments), then load current (or load voltage in other embodiments) is at a maximum value and the PV system 100 is operating in an MPT condition.

Controller 170 of FIG. 4 may be implemented in hardware, software, firmware, or any combination thereof. As an example, the controller 170 may comprise a digital signal processor (DSP) running software (not specifically shown) for performing the functions of the controller 170 described herein. Alternatively, the controller 170 may be implemented via logic gates for performing such functions. Other configurations of the controller 170 are possible in other embodiments.

Figure 5:
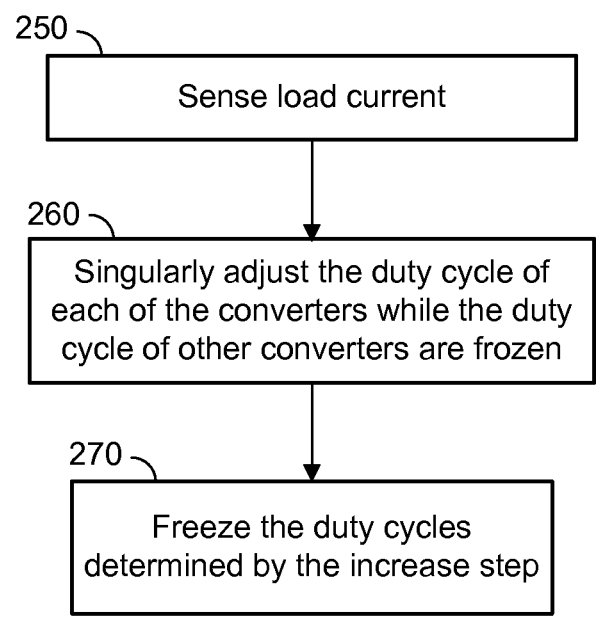
FIG. 5 depicts an exemplary method for providing maximum power transfer.

An exemplary method for providing maximum power transfer for PV system 100 of FIG. 4 is depicted in FIG. 5. The method, as depicted, assumes that the PV system 100 is operating at or near the maximum power transfer state. In order to keep the PV system in the maximum power state, converters 60 are adjusted to meet the needs of changing conditions of the PV panels 10. For example converters are adjusted when there is a sudden change in light energy irradiating the panel. A sensor continuously monitors the load current (or load voltage in other embodiments) and stores values of the monitored parameter in memory, block 250. Changes are made to the duty cycle of the first converter when the duty cycle of the second converter is frozen (or, in other words, held constant) and then similar changes are made to the duty cycle of the second converter when the first converter duty cycle is frozen, block 260. The new duty cycles as provided by the changes are frozen, block 270, and used by the converters until the changes step is repeated. The changes as described are determined using an implementation of the MPPT algorithm. The duty cycle for each converter may be changed periodically to ensure maximum power transfer occurs. Other events such as an unexpected change in load current or load voltage may initiate the duty cycle update step. For example if the load current changes by at least a certain amount, such as 5%, the duty cycles may be adjusted. Other events may also initiate the update step.

Figure 6:
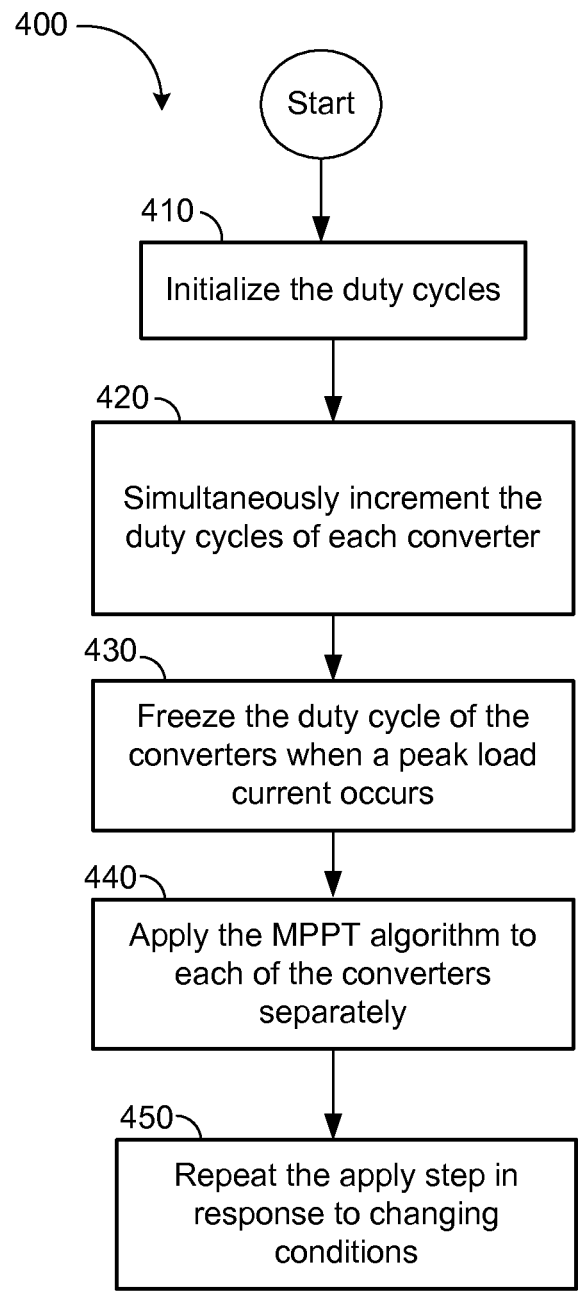
FIG. 6 depicts an exemplary for controlling a photovoltaic energy system, such as is depicted by FIG. 4.

When light energy irradiates the PV panel at the beginning of an energy collection period, a startup process is used to place the PV system 100 in the maximum power transfer state. Referring to FIG. 6, the first step is to initialize the duty cycle for each converter, block 410. The duty cycles values are chosen for initialization to be small (e.g., less than the duty cycles expected for maximum irradiation). Next all the duty cycles are incremented until the load current (or maximum voltage in other embodiments) reaches a peak value. The duty cycle values are then frozen at the values corresponding to the peak current, step 430. Next, the MPPT algorithm is applied to each converter when the duty cycles of the other converters are frozen, block 440. After all the converters have been adjusted separately, the PV system 100 is in the maximum power transfer state. The process of re-applying the MPPT algorithm to each converter separately may be repeated in response to changing conditions, block 450.

In several embodiments described above, the sensor 20 of FIG. 4 is configured to measure load current, and the controller 170 determines how to adjust the duty cycles of the converters 60 based on the sensed load current. That is, the controller 170 continues changing (increasing or decreasing) the duty cycle of a converter 60 in one direction as long as the changes continue to increase the load current. Once the load current decreases in response to a change of the duty cycle, then a maximum power transfer has been reached, and the controller 170 may stop changing the duty cycle. Moreover, the controller 170 sets the duty cycle of the converter 60 to that which provided the maximum measured load current.

However, in other embodiments, the sensor 20 may be configured to sense load voltage, and similarly control duty cycles of the converters 60 based on the sensed load voltage. For example, the controller 170 may continue changing (increasing or decreasing) the duty cycle of a converter 60 in one direction as long as the changes continue to increase the load voltage. Once the load voltage decreases in response to a change of the duty cycle, then maximum power transfer has been reached, and the controller 170 may stop changing the duty cycle. Moreover, the controller 170 sets the duty cycle of the converter 60 to that which provided the maximum measured load voltage.

A sensor 20 for measuring current may be used when the system load 25 has a constant voltage, such as a battery. In such cases, changes in the output power of a panel 10 results in a load current change. A sensor 20 for measuring voltage may be used when the system load 25 has a constant current. In such cases, changes in the output power of a panel 10 results in a load voltage change. In other embodiments, it is possible for sensing voltage or current. As an example, if a load is resistive, either load current or load voltage can be sensed.

In addition, in several embodiments described above, the converters 60 are adjusted one at a time. That is, as the duty cycle of one converter 60 is adjusted, the duty cycles of the other converters 60 are held constant until a suitable duty cycle for the one converter 60 being adjusted is found. After finding the desirable duty cycle for the one converter 60, the one converter 60 is set to the desirable duty cycle. Thereafter, the duty cycle of the next converter 60 is adjusted while the duty cycles of all other converters 60 are held constant. This process is repeated until the duty cycles have all been set to their optimum states one-by-one. In other embodiments, it is possible to adjust multiple converters at the same time.

For example, in one embodiment having a large number of converters 60, the converters 60 are adjusted in pairs. That is, the duty cycle of one converter 60 (referred to hereafter as the "first converter") is changed in one direction (increased or decreased), and the duty cycle of another converter 60 (referred to hereafter as the "second converter") is simultaneously changed in one direction (increased or decreased). Each time the duty cycle of the first converter 60 is updated, the duty cycle of the second converter 60 is also updated, though it is unnecessary for the changes to be in the same direction for both converters. As an example, the duty cycles of the first and second converters may be both increased for each update or, alternatively, decreased for each update. In another embodiment, the duty cycle of the first converter 60 may be increased for each update, and the duty cycle of the second converter 60 may be decreased for each update.

In any event, the duty cycles of the two converters 60 are repetitively updated until the parameter (current or voltage) measured by the sensor 20 decreases for one or more adjustments. The duty cycle of the first converter 60 is then set to that of the first converter 60 when the sensor 20 measured a maximum for the adjustments, and the duty cycle of the second converter 60 is set to that of the second converter 60 when the sensor 20 measured the maximum for the adjustments. After the duty cycles for the foregoing converter pair are set, the duty cycles for another converter pair may be similarly adjusted and set while the duty cycles for all other converters 60 are held constant. By simultaneously adjusting a grouping (i.e., a pair in this example) of converters 60 at the same time, the process of updating the converters 60 for changing conditions may be shortened. Note that in yet other embodiments, other numbers of converters 60 may be simultaneously updated.

Yet other techniques for optimizing the converter update process are possible. As an example, before determining the optimum duty cycle for the converters 60, the controller 170 may first adjust all of the converters 60 in unison during a mode, referred to hereafter as the "preliminary initialization mode," to bring them close to their optimum operating point before initiating any of the converter update processes described above in which the duty cycles of at least some of the converters are held constant while the duty cycle of at least one converter 60 is adjusted to find the optimum duty cycle for the converter 60 being adjusted.

In this regard, during the preliminary initialization mode, the controller 170 begins simultaneously adjusting the duty cycles of all of the converters 60 by the same amount in the same direction (increasing or decreasing). Further, for each adjustment, the duty cycle of each converter 60 may be equal to the duty cycles of the other converters 60, though it is also possible for the duty cycles to be different. The controller 170 continues updating the duty cycles of the converters 60 by the same amount and in the same direction as long as the parameter (e.g., voltage or current) measured by the sensor 20 continues to increase.

Once the parameter measured by the sensor 20 decreases for one or more adjustments, then a maximum energy transfer for this preliminary initialization mode has been found, and the controller 170 stops adjusting the converters 60 for the preliminary initialization mode. The controller 170 then sets the duty cycle of each converter 60 to the one that resulted in a maximum for the parameter measured by the sensor 20, thereby completing the preliminary initialization mode.

After completing the preliminary initialization mode, the duty cycles of the converters 60 have likely been set close to their optimum states. The controller 170 then adjusts and sets the duty cycles of the converters 60 in groupings of one or more to their optimum values. For example, the controller 170 may adjust the converters 60 one-by-one or in pairs (or other groupings) while holding the duty cycles of other converters 60 constant, as described above, until all of the converters 60 have been set to their optimum duty cycles. By first bringing the duty cycles of all of the converters 60 close to their optimum states in the preliminary initialization mode, the overall time required to set the converters 60 to their optimum duty cycles may be shortened relative to an embodiment that does not implement the preliminary initialization mode.

In addition, it should be noted that FIG. 4 shows a parallel arrangement of converters 60. The output of each converter 60 is coupled to the same power bus 65. Thus, the output voltage of each converter 60 is the same (i.e., equal to $V_L$). In such embodiment, the load current, $I_L$, is equal to a sum of the converter output currents, $I_{C1}$ and $I_{C2}$, of all of the converters 60. However, in other embodiments, other arrangements of the converters 60 are possible.

Figure 7:
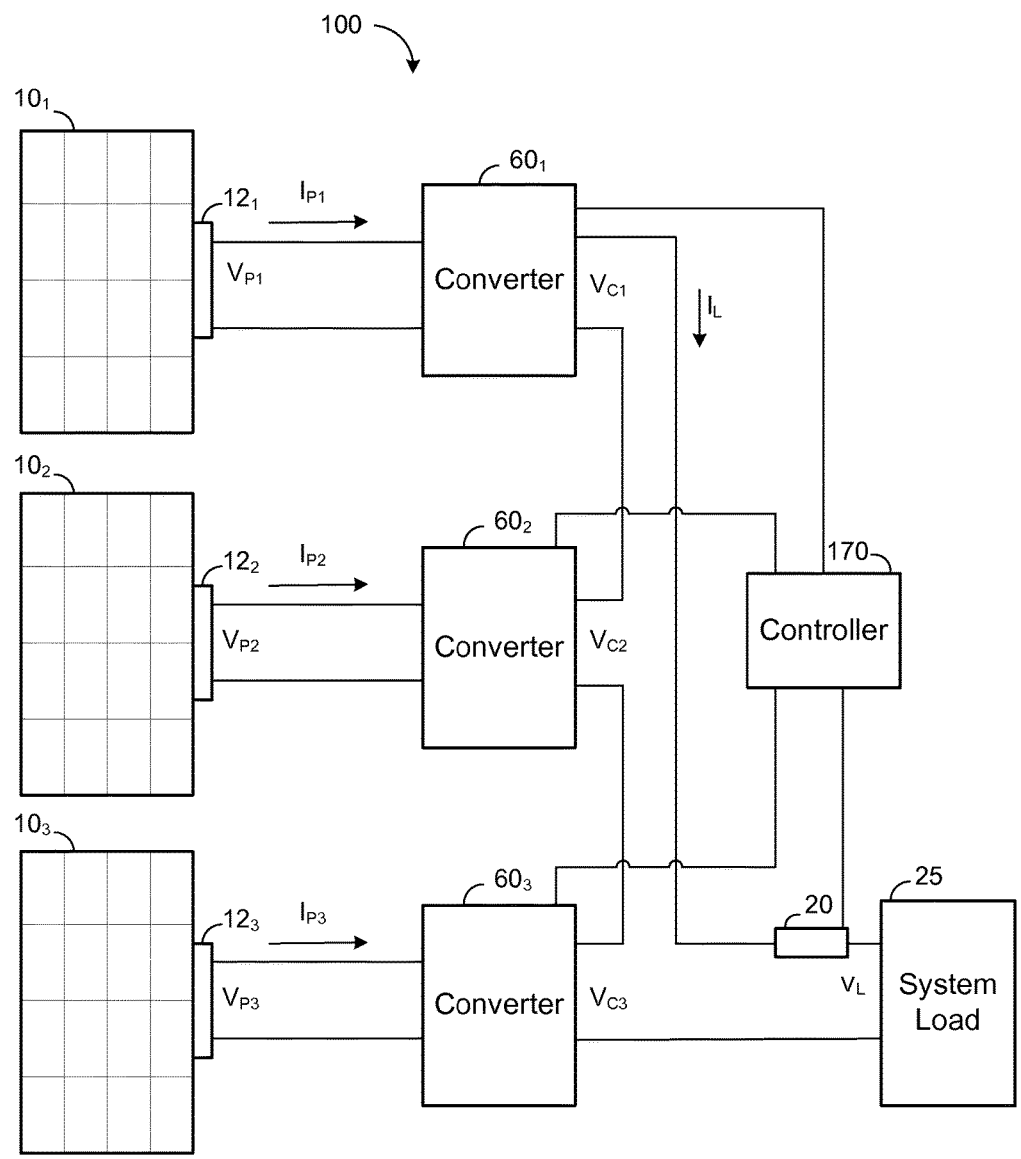
FIG. 7 depicts an exemplary embodiment of a photovoltaic system in accordance with the present disclosure.

As an example, FIG. 7 depicts a series arrangement of converters 60. As shown by FIG. 7, the converters $60_1$, $60_2$ and $60_3$ are coupled in series to the system load 25. The exemplary embodiment of FIG. 7 shows three converters $60_1$, $60_2$, and $60_3$ coupled in series, but any number of converters may be coupled in series in other embodiments. In a series arrangement, such as is depicted by FIG. 7, converter output current is the same and equal to the load current, $I_L$, received by the system load 25. However, the load voltage, $V_L$, is equal to a sum of the output voltages of all of the converters 60 in the series arrangement. Note that the output voltage of a given converter 60 is based on the current received from the converter's corresponding PV panel. As an example, the voltage drop across converter $60_3$ is based on the panel current, $I_{P3}$, from the PV panel $10_3$. In this regard, a greater current $I_{P3}$ increases the output voltage $V_{C3}$ of the converter $60_3$ thereby increasing the load voltage $V_L$. Similarly, the output voltage $V_{C2}$ of the converter $60_2$ is based on the panel current $I_{P2}$, and the output voltage $V_{C1}$ of the converter $60_1$ is based on the panel current $I_{P1}$. Further, $V_L$ is equal to the sum of $V_{C1}$, $V_{C2}$, and $V_{C3}$.

Note that the controller 170 may control the duty cycles of converters 601 and 602 in the series arrangement depicted by FIG. 7 according to the same techniques described above for the parallel arrangement depicted by FIG. 4. In other embodiments, the system 100 may have converters 60 in both series and parallel arrangements. The algorithms described herein for controlling the duty cycles of the converters 60 may be used for any arrangement of serial and/or parallel converters 60.

Although the disclosure is described in several embodiments, a variety of changes and modifications would be apparent to those skilled in the art without departing from the spirit and scope of the disclosure. In addition the systems and methods described may be applied to other energy systems. In this regard, the PV panels as shown in FIG. 4 may be replaced by other energy sources, such as, for example, fuel cells or wind turbines. In such case, the same algorithm may be used to control the converters in order to provide optimal power transfer. In some embodiments, the energy sources may be a mixture of PV panels, fuel cells, wind turbines and other such energy sources.

Now, therefore, the following is claimed:

1. A photovoltaic (PV) energy system, comprising:
   a first PV panel;
   a first power switching converter coupled to the first PV panel;
   a second PV panel;
   a second power switching converter coupled to the second PV panel;
   a system load coupled to the first power switching converter and the second power switching converter, the system load configured to receive a signal having current from each of the power switching converters;
   a sensor configured to sense the current or a voltage of the signal; and
   a controller configured to adjust energy transfer characteristics of each of the power switching converters based on the sensed current or voltage, the controller configured to adjust a duty cycle of the first power switching converter during a first time period while keeping a duty cycle of the second power switching converter constant, the controller further configured to adjust the duty cycle of the second power switching converter during a second time period while keeping the duty cycle of the first power switching converter constant, wherein adjustments to the duty cycle of the first power switching converter and adjustments to the duty cycle of the second power switching converter affect the current or the voltage of the signal received by the system load, wherein the controller is configured to set the duty cycle of the first power switching element based on measurements of the current or the voltage of the signal by the sensor during the first time period while the controller is adjusting the duty cycle of the first power switching converter and keeping the duty cycle of the second power switching converter constant, and wherein the controller is configured to set the duty cycle of the second power switching converter based on measurements of the current or the voltage of the signal by the sensor during the second time period while the controller is adjusting the duty cycle of the second power switching converter and keeping the duty cycle of the first power switching converter constant.

2. The system of claim 1, wherein the controller is configured to apply a maximum power point tracking algorithm to each converter at different instances of time.

3. The system of claim 1, wherein the first power switching converter is in series with the second power switching converter.

4. The system of claim 1, wherein the first power switching converter is in parallel with the second power switching converter.

5. A method for use in a photovoltaic (PV) energy system, comprising:
   combining current from a first power switching converter with current from a second power switching converter, thereby providing a combined signal, wherein the first power switching converter is coupled to a first PV panel and the second power switching converter is coupled to a second PV panel;
   driving a system load with the combined signal;
   sensing a current or a voltage of the combined signal with a sensor;
   controlling energy transfer characteristics of the first and second power switching converters based on the sensing, wherein the controlling comprises (1) adjusting a duty cycle of the first power switching converter during a first time period and (2) keeping a duty cycle of the second power switching converter constant during the adjusting the duty cycle of the first power switching converter;
   adjusting the duty cycle of the second power switching converter during a second time period;
   keeping the duty cycle of the first power switching converter constant during the second time period;
   setting the duty cycle of the first power switching converter for a third time period based on measurements of the current or the voltage of the combined signal during the first time period while the duty cycle of the first power switching converter is adjusted and the duty cycle of the second power switching converter is kept constant; and
   setting the duty cycle of the second power switching converter for the third time period based on measurements of the current or the voltage of the combined signal during the second time period while the duty cycle of the second power switching converter is adjusted and the duty cycle of the first power switching converter is kept constant.

6. A method for use in a photovoltaic (PV) energy system, comprising:
   receiving a first signal from a PV panel via a first power switching converter;
   receiving a second signal from a PV panel via a second power switching converter;
   combining the first signal and the second signal thereby forming a combined signal having current from each of the power switching converters;
   receiving the combined signal at a system load coupled to the first power switching converter and the second power switching converter;
   sensing, with a sensor, the current or a voltage of the combined signal;
   adjusting energy transfer characteristics of each of the power switching converters based on the current or the voltage sensed by the sensing;
   adjusting a duty cycle of the first power switching converter during a first time period while a duty cycle of the second power switching converter is held constant; and
   adjusting the duty cycle of the second power switching converter during a second time period while the duty cycle of the first power switching converter is held constant,
   wherein the adjusting the energy transfer characteristics comprises:
   setting the duty cycle of the first power switching converter for a third time period based on measurements of the current or the voltage of the combined signal during the first time period while the duty cycle of the first power switching converter is adjusted and the duty cycle of the second power switching converter is held constant; and
   setting the duty cycle of the second power switching converter for the third time period based on measurements of the current or the voltage of the combined signal during the second time period while the duty cycle of the second power switching converter is adjusted and the duty cycle of the first power switching converter is held constant.

7. The system of claim 6, wherein the first power switching converter is in series with the second power switching converter.

8. The system of claim 6, wherein the first power switching converter is in parallel with the second power switching converter.

\* \* \* \* \*